(12) United States Patent
Fang et al.

(10) Patent No.: US 10,635,882 B2
(45) Date of Patent: Apr. 28, 2020

(54) FINGERPRINT MODULE

(71) Applicant: SHANGHAI OXI TECHNOLOGY CO., LTD, Shanghai (CN)

(72) Inventors: Wei Fang, Shanghai (CN); Hong Zhu, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 0 days.

(21) Appl. No.: 15/765,948

(22) PCT Filed: Oct. 12, 2015

(86) PCT No.: PCT/CN2015/091743
§ 371 (c)(1),
(2) Date: Apr. 4, 2018

(87) PCT Pub. No.: WO2017/063120
PCT Pub. Date: Apr. 20, 2017

(65) Prior Publication Data
US 2018/0300523 A1   Oct. 18, 2018

(51) Int. Cl.
*G06K 9/00* (2006.01)
*F21V 8/00* (2006.01)
*G02F 1/1333* (2006.01)
*H05K 1/18* (2006.01)

(52) U.S. Cl.
CPC ......... *G06K 9/0004* (2013.01); *G02B 6/0083* (2013.01); *G02B 6/0088* (2013.01); *G02F 1/13338* (2013.01); *G06K 9/00046* (2013.01); *G06K 9/00053* (2013.01); *H05K 1/189* (2013.01); *H05K 2201/10106* (2013.01)

(58) Field of Classification Search
None
See application file for complete search history.

(56) References Cited

U.S. PATENT DOCUMENTS

| | | | |
|---|---|---|---|
| 2018/0120644 A1* | 5/2018 | Aeo | G02F 1/1336 |
| 2018/0300523 A1* | 10/2018 | Fang | G02B 6/0083 |
| 2018/0372938 A1* | 12/2018 | Zeng | G02B 6/009 |
| 2019/0293862 A1* | 9/2019 | Sokolov | G02B 6/0091 |

FOREIGN PATENT DOCUMENTS

| | | | |
|---|---|---|---|
| CN | 104598893 A | | 5/2015 |
| CN | 104636735 A | | 5/2015 |
| CN | 104794467 A | | 7/2015 |
| CN | 104899585 A | | 9/2015 |
| JP | 2004233256 A | * | 8/2004 |
| JP | 2004233256 A | | 8/2014 |

OTHER PUBLICATIONS

International Search Report and Written Opinion from PCT/CN2015/091743, dated Jun. 2, 2016.

* cited by examiner

*Primary Examiner* — Iman K Kholdebarin
(74) *Attorney, Agent, or Firm* — Adsero IP

(57) ABSTRACT

A fingerprint module, comprising: a first part comprising a sensor, and a cover glass disposed on the sensor; and a second part comprising a light guide plate, and a LED disposed aside the light guide plate, wherein the first part and the second part are separate. More degree of freedom of the fingerprint module achieved in assembly.

11 Claims, 4 Drawing Sheets

FINGERPRINT MODULE

CROSS-REFERENCE TO RELATED APPLICATIONS

The present application is the national phase of International Application No. PCT/CN2015/091743, filed on Oct. 12, 2015, and entitled "FINGERPRINT MODULE", the entire disclosure of which are incorporated herein by reference.

TECHNICAL FIELD

The present disclosure generally relates to fingerprint identification, and more particularly, to a fingerprint module.

BACKGROUND

Due to uniqueness of fingerprint and convenience for using fingerprint identification technology, fingerprint identification has been widely used in many fields such as security inspections, entrance guarding systems, personal computers, mobile phones, etc. A fingerprint module is a core part of the fingerprint identification technology, where the fingerprint module is categorized into optical fingerprint module, semiconductor fingerprint module, thermal fingerprint module, ultrasonic fingerprint module, etc. In prior art, the optical fingerprint module at least includes a cover glass, a sensor and a light guide plate, where the cover glass, the sensor and the light guide plate are one-by-one glued together using an optical glue or an optical tape, and the optical fingerprint module further includes a Light Emitting Diode (LED) disposed aside the light guide plate, where a luminous side of the LED faces the light guide plate.

SUMMARY

Embodiments of the present disclosure provide a fingerprint module, and the fingerprint module may include: a first part including a sensor, and a cover glass disposed on the sensor; and a second part including a light guide plate, and a LED disposed aside the light guide plate, where a luminous side of the LED may face the light guide plate; wherein the first part and the second part may be separate so as to achieve more degree of freedom in assembly.

In some embodiments, the cover glass of the first part may be embedded in an opening of a first housing, where the cover glass may be exposed by the first housing, and the sensor of the first part may be disposed beneath the first housing. A second housing may be disposed below the first housing, and the second housing may have a tank, where the sensor of the first part may be disposed in the tank. The second part may be disposed below the sensor of the first part, and be also disposed in the tank of the second housing without contacting with the first part.

In some embodiments, the light guide plate and the LED may be disposed on a flexible printed circuit board, where the flexible printed circuit board may be glued on the bottom of the tank of the second housing.

In some embodiments, a second housing may be disposed below the first housing, where the sensor of the first part may be disposed between the first housing and the second housing, and the second part may be disposed below the second housing. The second housing may include an opening allowing lights from the second part passing through the second housing and propagating to the first part.

In some embodiments, a printed circuit board may be disposed beneath the second housing, and have an opening, where a flexible printed circuit board may be embedded in the opening, and the light guide plate and the LED may be disposed on the flexible printed circuit board.

In some embodiments, a printed circuit board may be disposed beneath the second housing, and the light guide plate and the LED may be integrated on the printed circuit board corresponding to the opening of the second housing.

In some embodiments, the sensor of the first part may be disposed between the first housing and a printed circuit board. The printed circuit board may be disposed on a second housing. The second housing may be disposed above a LCD module, where the LCD module may at least include a LCD, the light guide plate and the LED, and the LCD module may be adapted to provide lights from the LED to the first part. The second housing and the printed circuit board may respectively have an opening allowing the lights from the LCD module passing through both the second housing and the printed circuit board and propagating to the first part.

The embodiments of the present disclosure possess advantages: more degree of freedom of the fingerprint module may be achieve in assembly so as to reduce assembly complexity of the fingerprint module or thickness of a device in which the fingerprint module is mounted or both

DETAILED DESCRIPTION

In prior art, an optical fingerprint module may at least include: a cover glass, a sensor and a light guide plate, where the cover glass, the sensor and the light guide plate may be one-by-one glued together using an optical glue or an optical tape, and the optical fingerprint module may further includes: a LED disposed aside the light guide plate, where a luminous side of the LED faces the light guide plate.

Figure 1:
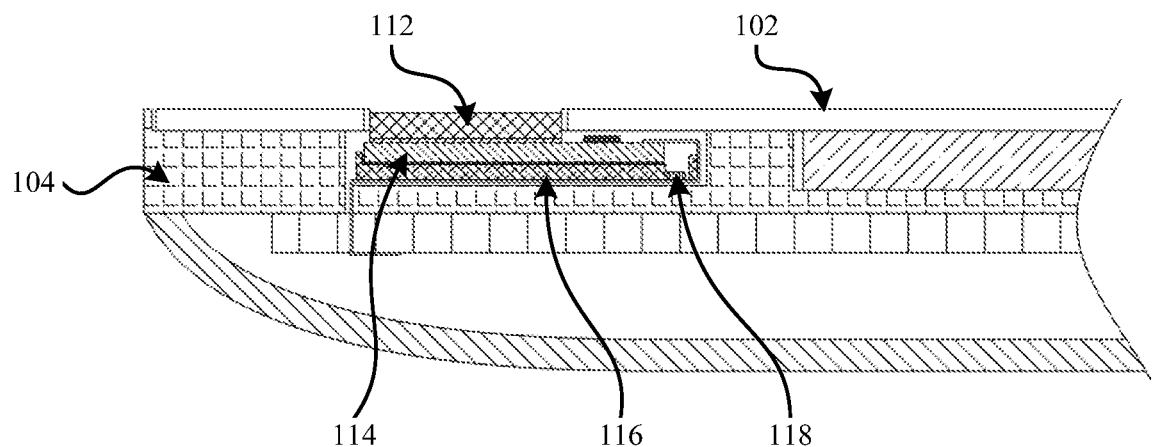
FIG. 1 schematically illustrates a structural diagram presenting a fingerprint module in prior art.

FIG. 1 schematically illustrates a structural diagram presenting a fingerprint module in prior art. Referring to FIG. 1, a fingerprint module 100 is provided, and the fingerprint module 100 at least includes: a cover glass 112, a sensor 114 disposed below the cover glass 112, a light guide plate 116 disposed below the sensor 114 and a LED 118 disposed aside the light guide plate 116, wherein a luminous side of the LED 118 faces the light guide plate 116. The cover glass 112 and the sensor 114 are glued together using an optical glue or an optical tape, and the sensor 114 and the light guide plate 116 are glued together using an optical glue, an optical tape or a double side tape. The cover glass 112 is embedded in an opening of a first housing 102 and the cover glass 112 is exposed by the first housing 102. A second housing 104 is disposed beneath the first housing 102, and the second housing 104 has a tank, where the sensor 114, light guide plate 116 and the LED 118 of the fingerprint module 100 are disposed in the tank.

Figure 2:
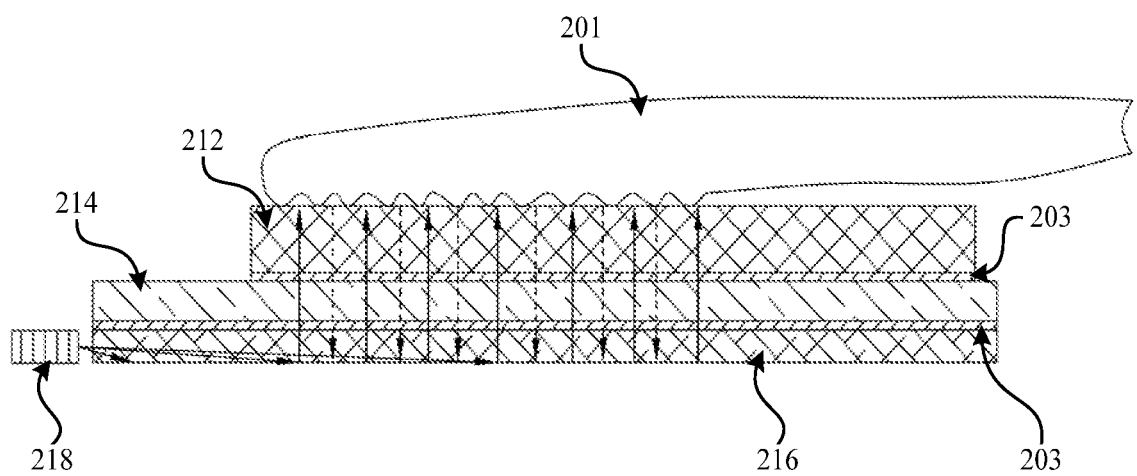
FIG. 2 schematically illustrates a structural diagram presenting an optical fingerprint sensor for demonstrating the operating mechanism of the optical fingerprint sensor.

From above, it is appreciated by those skilled in the art that an optical fingerprint module may at least include an optical fingerprint sensor. FIG. 2 schematically illustrates a structural diagram presenting an optical fingerprint sensor in order to demonstrate the operating mechanism of the optical fingerprint sensor. Referring to FIG. 2, an optical fingerprint sensor 200 is provided, and the optical fingerprint sensor 200 at least includes: a cover glass 212, a sensor 214 disposed below the cover glass 212, a light guide plate 216 disposed below the sensor 214 and a LED 218 disposed aside the light guide plate 216, where a luminous side of the LED 218 faces the light guide plate 216. The cover glass 212 and the sensor 214 are stuck together using a UV tape 203, and the sensor 214 and the light guide plate 216 are stuck together also using the UV tape 203.

As shown in FIG. 2, the LED 218 is adapted to emit incident lights that have a form of point light, and the incident lights propagate into the light guide plate 216, where the light guide plate 216 transforms the incident lights from the form of point light into a form of planar light. Further referring to FIG. 2, the incident lights with the form of planar light propagate through the sensor 214 and the cover glass 212, and then are reflected by a finger 201 to form reflected lights. The reflected lights propagate back to the sensor 214 and may be detected by the sensor 214.

Furthermore, an integrated circuit may be disposed on the sensor 214, where the integrated circuit is adapted to transform optical information carried by the reflected lights into electric information for further fingerprint identification.

Figure 3:
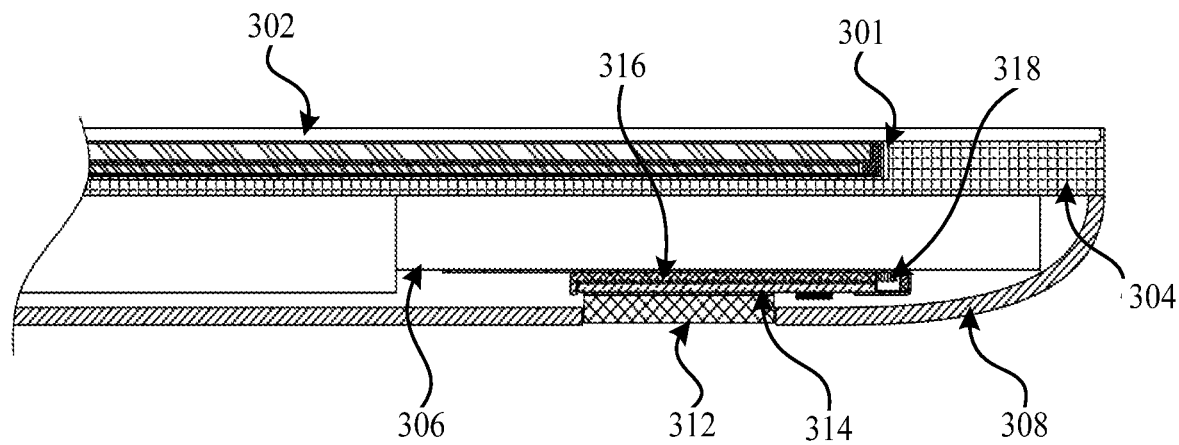
FIG. 3 schematically illustrates a structural diagram presenting another fingerprint module in prior art.

FIG. 3 schematically illustrates a structural diagram presenting another fingerprint module in prior art. Referring to FIG. 3, a fingerprint module 300 is provided, and the fingerprint module 300 includes: a cover glass 312, a sensor 314 disposed below the cover glass 312, a light guide plate 316 disposed below the sensor 314 and a LED 318 disposed aside the light guide plate 316, where a luminous side of the LED 318 faces the light guide plate 316. The cover glass 312, the sensor 314 and the light guide plate 316 are one-by-one glued together. The cover glass 312 is embedded in an opening of a third housing 308 and the cover glass 312 is exposed by the third housing 308. The sensor 314, the light guide plate 316 and the LED 318 are disposed between the third housing 308 and a printed circuit board 306. The printed circuit board 306 is disposed on a second housing 304, and the second housing 304 is disposed on a LCD module 301 and a first housing 302, where the LCD module 301 may at least include a LED (not shown), a light guide plate (not labeled) and a LCD (labeled). Moreover, the first housing 302 is opposite to the third housing 308.

By research, the inventor has discovered that fingerprint modules in prior art may have limited degree of freedom, which may constrain reduction of assembly complexity of the fingerprint modules or reduction of thickness of devices in which the fingerprint modules are mounted. Thus, a fingerprint module which can achieve more degree of freedom may be required.

Embodiments of the present disclosure provide a fingerprint module, which may at least include: a first part including a cover glass, and a sensor disposed below the cover glass; and a second part including a light guide plate and a LED disposed aside the light guide plate, wherein a luminous side of the LED faces the light guide plate, wherein the first part and the second part are separate so as to achieve more degree of freedom in assembly.

In order to clarify the objects, characteristics and advantages of the present disclosure, embodiments of the present disclosure will be described in detail in conjunction with the accompanying drawings. References to "one embodiment", "an embodiment", "another embodiment", "yet another embodiment" or their respective variations in the present disclosure are not necessarily references to a same embodiment; and, such references mean at least one.

Figure 4:
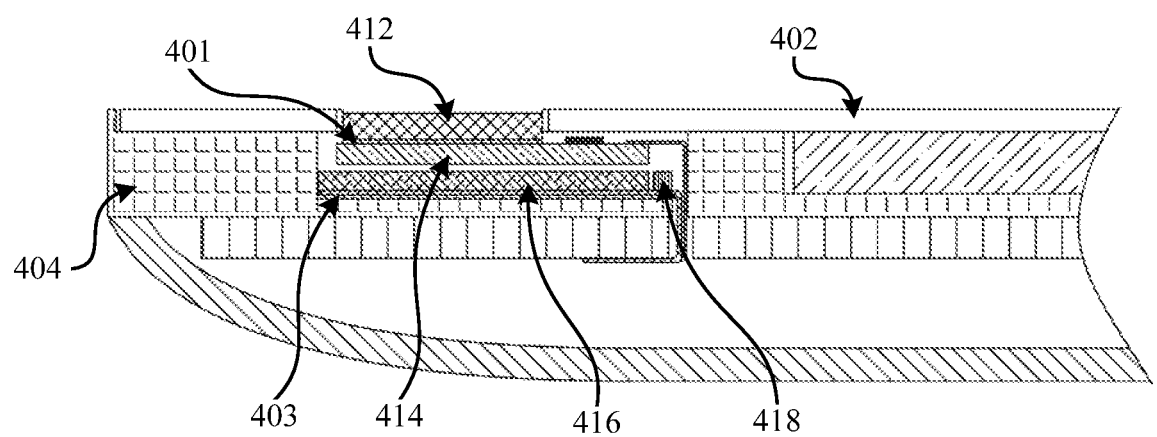
FIG. 4 schematically illustrates a structural diagram presenting a fingerprint module according to one embodiment in the present disclosure.

FIG. 4 schematically illustrates a structural diagram presenting a fingerprint module according to one embodiment in the present disclosure. Referring to FIG. 4, a fingerprint module 400 is provided, and the fingerprint module 400 includes a first part including a cover glass 412, and a sensor 414 disposed below the cover glass 412, where the cover glass 412 and the sensor 414 are stuck together using a UV tape 401; and a second part including a light guide plate 416 and a LED 418 disposed aside the light guide plate 416, where a luminous side of the LED 418 faces the light guide plate 416; wherein the first part and the second part are separate so as to achieve more degree of freedom in assembly.

In some embodiments, the cover glass 412 and the sensor 414 may be glued together using other optical glues or other optical tapes.

Referring to FIG. 4, the cover glass 412 is embedded in an opening of a first housing 402 and exposed by the first housing 402. A second housing 404 is disposed beneath the first housing 402, where the second housing 404 has a tank. The sensor 414 is disposed beneath the first housing 402, and is disposed in the tank of the second housing 404. The light guide plate 416 and the LED 418 are also disposed in the tank of the second housing 404, and are disposed below the sensor 414 of the first part and without contacting with the first part.

In some embodiments, an integrated circuit (not labeled) may be disposed on the sensor 414, where the integrated circuit is adapted to transform optical information detected by the sensor 414 into electric information for further fingerprint identification.

In some embodiments, the light guide plate 416 and the LED 418 may be disposed on a Flexible Printed Circuit board (FPC, not labeled), where the FPC may be stuck on the bottom of the tank using a double side tape 403.

Figure 5:
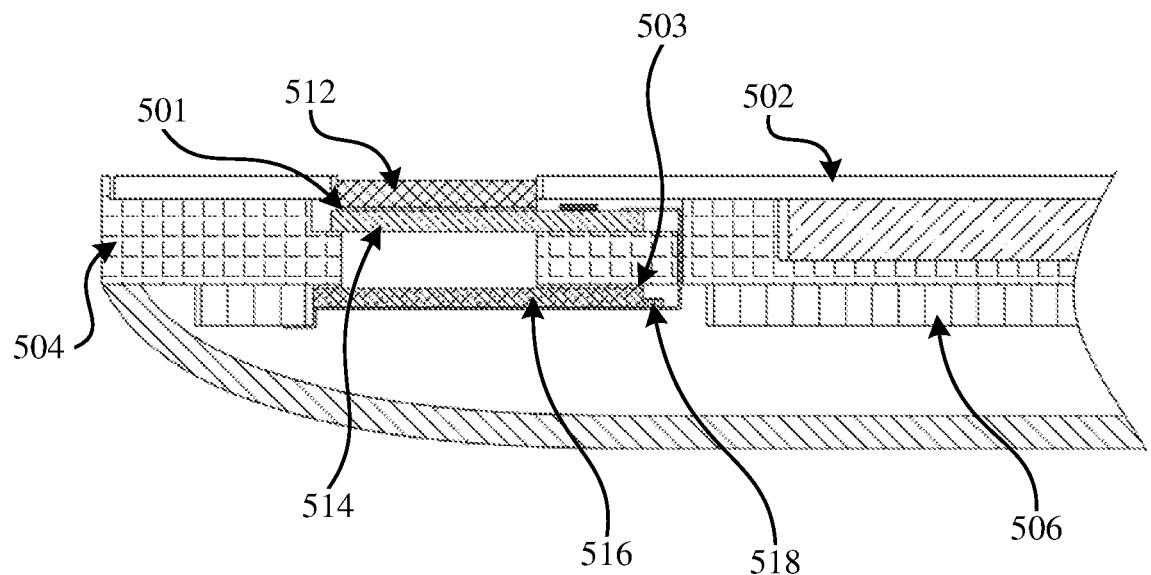
FIG. 5 schematically illustrates a structural diagram presenting a fingerprint module according to another embodiment in the present disclosure.

FIG. 5 schematically illustrates a structural diagram presenting a fingerprint module according to another embodiment in the present disclosure. Referring to FIG. 5, a fingerprint module 500 is provided, and the fingerprint module 500 includes a first part including a cover glass 512, and a sensor 514 disposed below the cover glass 512, where the cover glass 512 and the sensor 514 are stuck together using a UV tape 501; and a second part including a light guide plate 516 and a LED 518 disposed aside the light guide plate 516, where a luminous side of the LED 518 faces the light guide plate 516; wherein the first part and the second part are separate so as to achieve more degree of freedom in assembly.

In some embodiments, the cover glass 512 and the sensor 514 may be glued together using other optical glues or other optical tapes.

Referring to FIG. 5, the cover glass 512 is embedded in an opening of a first housing 502 and exposed by the first housing 502. A second housing 504 is disposed below the first housing 502. The sensor 514 is disposed between the first housing 502 and the second housing 504. The second part of the fingerprint module 500 is disposed below the second housing 504, where the light guide plate 516 and the second housing 504 are stuck together using a double side tape 503.

In this embodiment, the second housing 504 has an opening allowing lights from the second part of the fingerprint module 500 passing through the second housing 504 and propagating to the first part of the fingerprint module 500, and, moreover, a printed circuit board 506 is disposed beneath the second housing 504.

In some embodiments, the printed circuit board 506 may have an opening, where a FPC (not labeled) may be embedded in the opening, and the light guide plate 516 and the LED 518 may be disposed on the FPC.

In some embodiments, the light guide plate 516 and the LED 518 may be integrated on the printed circuit board 506 corresponding to the opening of the second housing 504.

In some embodiments, an integrated circuit (not labeled) may be disposed on the sensor 514, where the integrated circuit is adapted to transform optical information detected by the sensor 514 into electric information for further fingerprint identification.

Therefore, due to the second part of the fingerprint module 500 may be embedded in the opening of the printed circuit board 506 or directly integrated on the printed circuit board 506, thickness of a device in which the fingerprint module 500 is mounted may be reduced.

Figure 6:
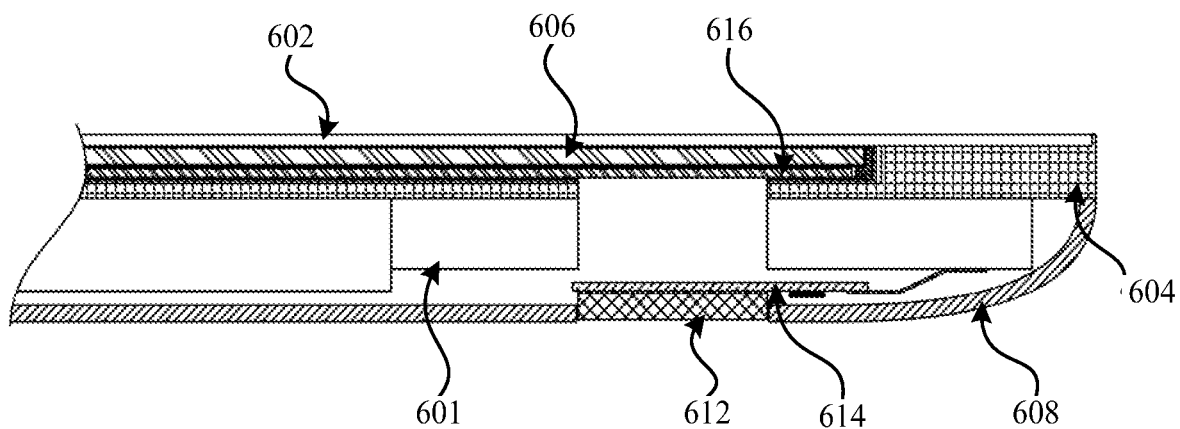
FIG. 6 schematically illustrates a structural diagram presenting a fingerprint module according to another embodiment in the present disclosure.

FIG. 6 schematically illustrates a structural diagram presenting a fingerprint module according to another embodiment in the present disclosure. Referring to FIG. 6, a fingerprint module 600 is provided, and the fingerprint module 600 includes a first part including a cover glass 612, and a sensor 614 disposed below the cover glass 612, where the cover glass 612 and the sensor 614 are stuck together using a UV tape (not shown); and a second part including a light guide plate 616, and a LED (not shown) disposed aside the light guide plate 616, where a luminous side of the LED faces the light guide plate 616; wherein the first part and the second part are separate so as to achieve more degree of freedom in assembly.

In some embodiments, the cover glass 612 and the sensor 614 may be glued together using other optical glues or other optical tapes.

Referring to FIG. 6, the cover glass 612 is embedded in an opening of a third housing 608 and exposed by the third housing 608. The sensor 614 is disposed between the third housing 608 and a printed circuit board 601. A second housing 604 is disposed below the printed circuit board 601, and a LCD module is disposed between the second housing 604 and a first housing 602, where the LCD module may at least include a LCD (not labeled), the light guide plate 616 and the LED (not shown). In this embodiment, the LCD module is adapted to provide lights to both the LCD and the first part of the fingerprint module 600. Further, in this embodiment, both the printed circuit board 601 and the second housing 604 respectively have an opening allowing lights from the LCD module passing through both the printed circuit board 601 and the second housing 604 and propagating to the first part of fingerprint module 600.

In some embodiments, the sensor 614 is coupled with the printed circuit board 601 via a FPC (not labeled).

In some embodiments, an integrated circuit (not labeled) may be disposed on the sensor 614, where the integrated circuit is adapted to transform optical information detected by the sensor 614 into electric information for further fingerprint identification.

Accordingly, due to the LED in the LCD module may provide lights to both the LCD and the first part of the fingerprint module 600, assembly complexity of the fingerprint module 600 and thickness of a device in which the fingerprint module 600 is mounted may both be reduced.

Figure 7:
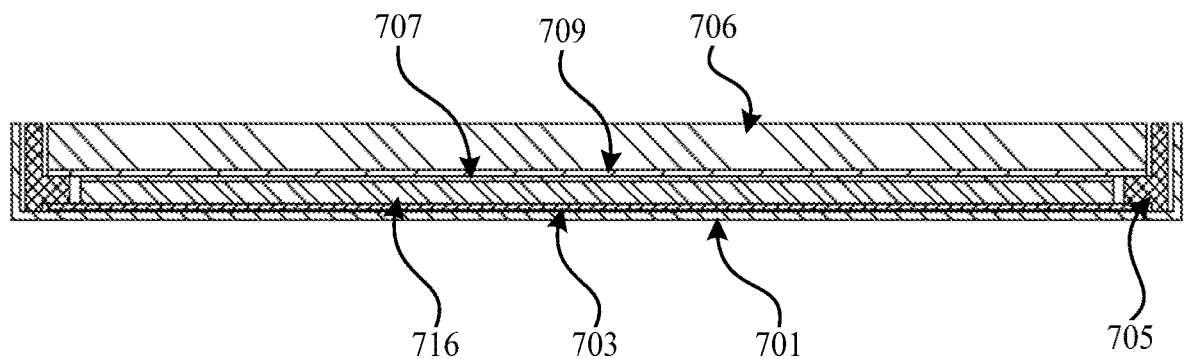
FIG. 7 schematically illustrates a structural diagram presenting a LCD module according to one embodiment in the present disclosure.

FIG. 7 schematically illustrates a structural diagram presenting a LCD module according to one embodiment in the present disclosure. The LCD module 700 is provided, and the LCD module 700 includes: a LCD 706; at least one optical film 707 disposed above the LCD 706, where the LCD 706 and the at least one optical film 707 are stuck together using a double side tape 709, and the at least one optical film 707 is adapted to enhance brightness; a fourth housing 705 disposed at both sides of the LCD 706 and the at least one optical film 707; a light guide plate 716 disposed on the at least one optical film 707 and between the fourth housing 705; a LED (not shown) disposed aside the light guide plate 716 and also between the fourth housing 705, where a luminous side of the LED faces the light guide plate 716; a reflector 703 disposed on the light guide plate 716; and a bezel 701 disposed outside the reflector 703 and the fourth housing 705, where the bezel 701 is adapted to strengthen the LCD module.

Specifically, both the at least one optical film 707 and the double side tape 709 are non-opaque allowing lights propagating through both the at least one optical film 707 and the double side tape 709.

Specifically, the fourth housing 705 is adapted to strengthen the LCD module, and immobilize the light guide plate 716, the at least one optical film 707 and the reflector 703.

Specifically, the LED (not shown) is adapted to emit incident lights that have a form of point light, and the incident lights propagate into the light guide plate 716, where the light guide plate 716 transforms the incident lights from the form of point light into a form of planar light.

Specifically, the reflector 703 is adapted to reflect the incident lights propagating to a surface of the light guide plate 716 not facing the LCD 706, and then, the reflected lights propagate to the LCD 706 via the at least one optical film 707 and the double side tape 709.

Furthermore, both the bezel 701 and the reflector 703 respectively have an opening allowing the lights from the second part passing through both the bezel 701 and the reflector 703 and propagating to a first part of a fingerprint module. Therefore, the lights from the LED may propagate to both the LCD 706 and the first part of the fingerprint module.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:
1. An optical fingerprint module, comprising:
a first part comprising a sensor, and a cover glass disposed on the sensor; and
a second part comprising a light guide plate, and a LED disposed aside the light guide plate;
wherein incident lights emitted from the LED propagate through the light guide plate, the sensor and the cover glass, and are reflected by a finger on the cover glass to form reflected lights, and the reflected lights propagate back to the sensor and are detected by the sensor;

wherein the first part and the second part are separate;

wherein the cover glass of the first part is embedded in an opening of a first housing, where the cover glass is exposed by the first housing, and the sensor of the first part is disposed beneath the first housing; and wherein a second housing is disposed below the first housing, where the sensor of the first part is disposed between the first housing and the second housing, and the second part is disposed below the second housing.

2. The optical fingerprint module according to claim 1, wherein the second housing comprises an opening allowing lights from the second part passing through the second housing and propagating to the first part.

3. The optical fingerprint module according to claim 2, wherein a printed circuit board is disposed beneath the second housing, and has an opening, where a flexible printed circuit board is embedded in the opening, and the light guide plate and the LED are disposed on the flexible printed circuit board.

4. The optical fingerprint module according to claim 2, wherein a printed circuit board is disposed beneath the second housing, and the light guide plate and the LED are integrated on the printed circuit board corresponding to the opening of the second housing.

5. The optical fingerprint module according to claim 1, wherein the sensor of the first part is disposed between the first housing and a printed circuit board.

6. The optical fingerprint module according to claim 5, wherein the printed circuit board is disposed on a second housing.

7. The optical fingerprint module according to claim 6, wherein the second housing is disposed above a LCD module, where the LCD module at least comprises a LCD, the light guide plate and the LED, and the LCD module is adapted to provide lights from the LED to the first part.

8. The optical fingerprint module according to claim 7, wherein the second housing and the printed circuit board respectively comprise an opening allowing the lights from the LCD module passing through both the second housing and the printed circuit board and propagating to the first part.

9. The optical fingerprint module according to claim 7, wherein the LCD module further comprises:
at least one optical film disposed above the LCD;
a reflector disposed on the light guide plate; and
a bezel disposed outside the reflector and configured to strengthen the LCD module;
wherein the light guide plate is disposed on the at least one optical film, and the reflector is configured to reflect the incident lights propagating to a surface of the light guide plate not facing the LCD, so that the reflected lights propagate to the LCD via the at least one optical film.

10. The optical fingerprint module according to claim 9, wherein the LCD module further comprises:
a fourth housing, disposed at both sides of the LCD, the at least one optical film, the LED, the light guide plate and the reflector, and configured to strengthen the LCD module and to immobilize the light guide plate, the at least one optical film and the reflector;
wherein the bezel is disposed outside the fourth housing.

11. The optical fingerprint module according to claim 9, wherein the at least one optical film is non-opaque.

* * * * *